United States Patent [19]

Kruper

[11] 4,204,128

[45] May 20, 1980

[54] ADJUSTABLE TIME DELAY RELAY

[75] Inventor: Andrew P. Kruper, Penn Hills, Pa.

[73] Assignee: Westinghouse Electric Corp., Pittsburgh, Pa.

[21] Appl. No.: 885,923

[22] Filed: Mar. 13, 1978

[51] Int. Cl.² .......................................... H01H 43/06
[52] U.S. Cl. .................................. 307/141; 307/126; 361/196
[58] Field of Search ............... 307/141, 141.4, 126; 361/160, 195, 196, 197, 198

[56] References Cited

U.S. PATENT DOCUMENTS

| 3,564,346 | 2/1971 | Atkins | 361/196 |
| 3,899,717 | 8/1975 | Legatti | 361/195 |

Primary Examiner—Donald A. Griffin
Assistant Examiner—S. D. Schreyer
Attorney, Agent, or Firm—Robert E. Converse, Jr.

[57] ABSTRACT

An adjustable time delay relay is provided which is particularly suitable for automatic transfer switches and other applications requiring a relatively long time delay during periods when electrical power is not available. The relay includes a relay coil connected across a large storage capacitor supplied from an AC power source through a diode.

The timing function is provided by a separate timing capacitor which, upon discharge through an associated adjustable resistor, operates a switching transistor to establish a low impedance path across the relay coil, thus discharging the storage capacitor and de-energizing the relay. Such a construction eliminates the need for a close tolerance, high value storage capacitor and provides a high degree of time delay reproducibility despite variations in power supply voltage.

15 Claims, 2 Drawing Figures

ADJUSTABLE TIME DELAY RELAY

BACKGROUND OF THE INVENTION

1. Field of the Invention

The invention relates generally to electrical apparatus, and, more particularly, to adjustable time delay relays employing solid state electronic components to establish the delay period.

2. Description of the Prior Art

Time delay relays are known which use a variety of components including solid-state, electromechanical, thermal, and pneumatic devices to establish a delay period. Only a limited number of types are available, however, which can operate in the absence of power. An application requiring such a time delay relay is an automatic transfer switch for connecting an electrical load to an emergency power source upon failure of the normal power source. Typically, a diesel-powered generator is provided on a standby basis to be started upon failure of the utility supply. The diesel engine is started after a suitable time delay to insure that the failure of the utility supply is not merely a transient condition. Thus, there often is no power available during the time delay period.

One time delay relay commonly used in this application employs a pneumatic device having a spring-loaded dashpot to operate a pair of relay contacts. Care must be taken, however, to ensure that the air orifice which determines the delay interval is free of dust and other contaminants. In addition, a pneumatic time delay relay has a relatively high cost.

A device using electrical components to produce a time delay typically employs a DC relay having a coil shunted by a large storage capacitor energized from the power line through a diode. Such a relay will energize at approximately 75% of rated voltage. The time constant of the capacitor and relay coil resistance determines the length of time required following failure of the power supply for the relay contacts will drop out. Since a DC relay typically drops out at 15 to 20% of normal operating voltage, the time delay is approximately 2 time constants of the storage capacitor and relay coil resistance. With a 120 microfarad capacitor and a 10,000 ohm relay coil, the delay will be approximately 2½ seconds. Longer time delays may be obtained by increasing the value of the capacitor.

Such a timer is relatively low in cost. However, the delay period is dependent on the line voltage at the time of power supply failure. In an automatic transfer switch, line voltage can drop to as low as 70% of normal voltage before actual failure of the line, thus producing a substantial variation in the delay period. In addition, the large capacitors required to obtain the desired delay periods have a wide tolerance. The combination of these two factors can produce a delay period variation of as much as 250% of the design value. It is also quite difficult to provide an adjustable delay period using such a device.

It would therefore be desirable to provide a time delay relay which combines the low cost and lower maintenance requirements of the electrical delay timer with the accuracy of a pneumatic timer.

SUMMARY OF THE INVENTION

In accordance with a preferred embodiment of the present invention, there is provided an adjustable time delay relay comprising a power switch device having input and output terminals, energy storage means connected across the power switch input terminals, and shorting means connected across the input terminals and energy storage means. The shorting means are operable when actuated to establish a low impedance path across the energy storage means and deenergize the power switch device. A parallel combination of a resistor and a timing capacitor is connected to the shorting means such that discharge of the timing capacitor through the resistor is operable to actuate the shorting means. Means are provided for connecting an associated electrical power source to the parallel combination and to the energy storage means. The values of the resistor and the timing capacitor and the capacity of the energy storage means are selected such that upon failure of the associated power source, the energy storage means will maintain energization of the power switch device until the timing capacitor has discharged an amount sufficient to operate the shorting means.

DESCRIPTION OF THE PREFERRED EMBODIMENT

Figure 1:
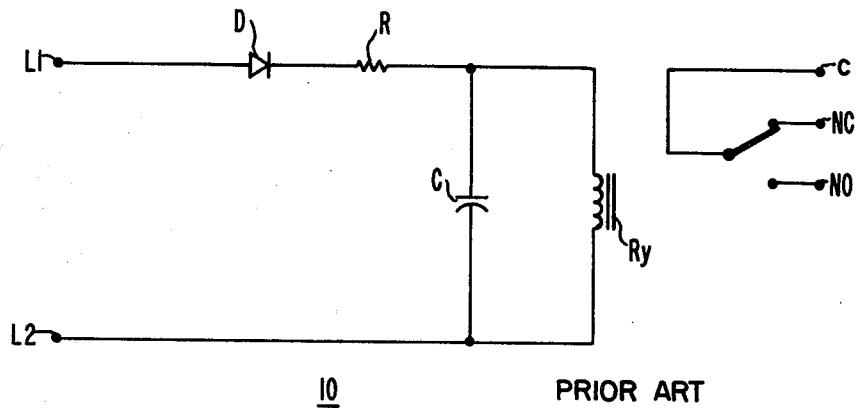
FIG. 1 is an electrical schematic diagram of a prior art time delay relay incorporating electrical components to establish the delay period.

Referring now to the drawings, in which like reference characters refer to corresponding elements, FIG. 1 is an electrical schematic diagram of a prior art time delay relay 10 using a large storage capacitor C. The relay 10 includes a relay coil Ry controlling the three contacts c, NC, and NO. The capacitor C is connected across the relay coil Ry and the combination connected through a series resistor R and a diode rectifier D to the utility power line conductors L1 and L2. Under normal operation, the relay coil Ry is energized by DC pulses supplied by L1 and L2 through the diode D. Upon failure of the power source connected to L1 and L2, the relay coil Ry will remain energized as the energy stored in capacitor C discharges through the coil Ry. The diode D serves to block the flow of current back into the leads L1 and L2. After a specified time delay determined by the resistance of the coil Ry and the value of the capacitor C, the voltage across the capacitor C will no longer be sufficient to maintain energization of the coil Ry. The contacts will then return to the deenergized position.

Although the device 10 is economical to manufacture and performs adequately in certain applications, it exhibits several disadvantages. The time delay period from failure of the power source until deenergization of the relay coil Ry is dependent upon the amount of charge stored in the capacitor C. This is, in turn, dependent upon the voltage appearing across the lines L1 and L2 just prior to failure. The time delay period is therefore dependent upon this voltage. Furthermore, in order to obtain time delays of the magnitude desired, the capacitor C must have a large value. In such a capacitor, tolerances of +100% to −10% of the stated value are common. Thus, a considerable variation of time delay from the design value is produced.

Figure 2:
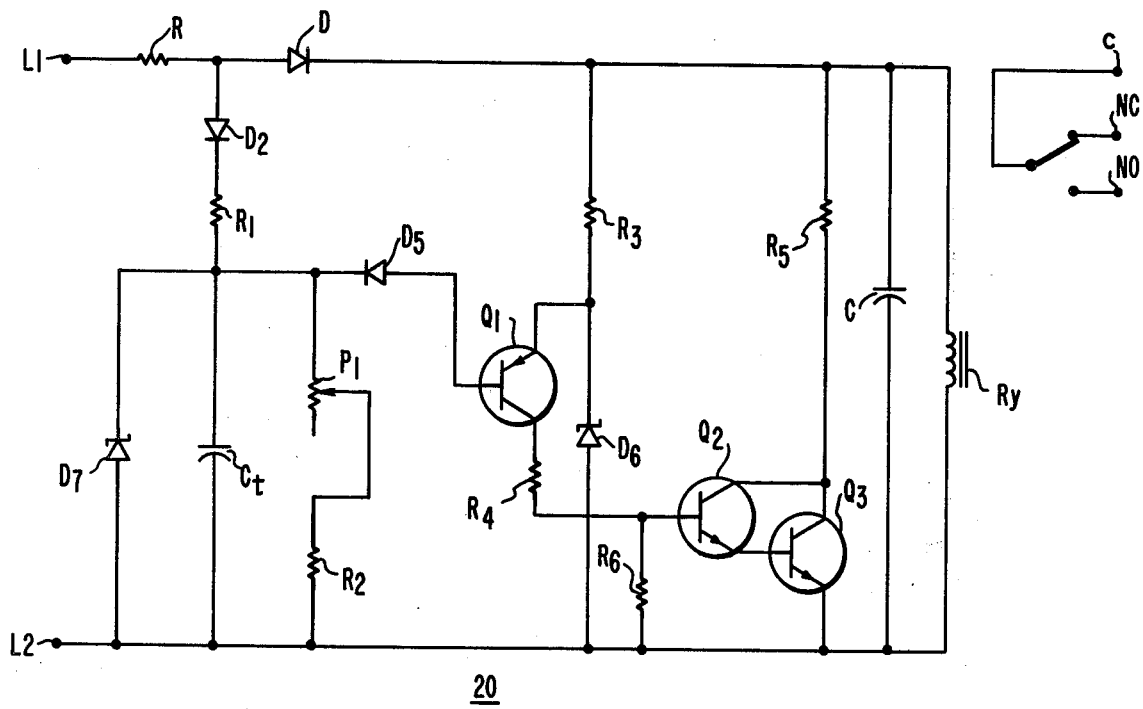
FIG. 2 is an electrical schematic diagram of an adjustable time delay relay incorporating the principles of the present invention.

FIG. 2 shows an adjustable time delay relay 20 incorporating the principles of the present invention. As in the prior art relay 10, the relay 20 includes a relay coil Ry operating contacts c, NC, and NO. A large storage capacitor C is connected across the coil Ry and the combination connected through a diode D and a limiting resistor R to line conductors L1 and L2, which are in turn connected to an electrical power source. The value of the storage capacitor C is chosen to be large enough so that even at reduced line voltage, for example, 70% of normal, the time constant of the resistance of the relay coil Ry and capacitance of the capacitor C is long enough such that the relay coil Ry will not deenergize before the maximum delay period desired. A typical value is 10,000 ohms for Ry and 800 microfarads for C, thus giving a maximum off delay of approximately 10 seconds. At normal line voltage the delay period is approximately $2 \times 10,000 \times 800 \times 10^{-6}$, or 16 seconds. At 70% of line voltage, the delay period is approximately $16 \times 0.7$ or 11.2 seconds.

The actual timing function, however, is not performed by discharge of the capacitor C through the relay coil Ry. Instead, this function is performed by additional circuit components and is adjustable from a fraction of a second to a maximum value of approximately 10 seconds.

As can be seen in FIG. 2, a diode D2 is connected in series with resistor R1 and a timing capacitor $C_t$. The series combination is connected at one end to the junction of the limiting resistor R and the diode D, and at the other end to the line conductor L2. A zener diode D7 is connected across the capacitor $C_t$ as is the series combination of variable resistor P1 and resistor R2.

Voltage sensing means, such as a transistor Q1 and zener diode D6, are provided, having an input connected through a blocking diode D5 to the junction of resistor R1, zener diode D7, timing capacitor $C_t$, and variable resistor P1. The series combination of a resistor R3 and zener diode D6 is connected across the parallel combination of the relay coil Ry and capacitor C. The emitter of voltage sensing transistor Q1 is connected to the junction of R3 and zener diode D6. The collector of voltage sensing transistor Q1 is connected through resistor R4 to the input of a Darlington amplifier Q2, Q3. The output of the Darlington amplifier Q2, Q3 is connected through resistor R5 across the capacitor C. Resistor R6 provides proper biasing for the Darlington pair Q2, Q3.

Timing capacitor $C_t$ is a ±5% tolerance 5 microfarad capacitor. This capacitor along with variable resistor P1 determines the time delay. Zener diode D7 provides a fixed voltage on $C_t$ under all line voltages down to 70% of normal. The second zener diode D6 is energized by the capacitor C. The zener voltage of D7 can be approximately 40 volts and the zener voltage of D6 approximately 7.5 volts.

When the power source connected to lines L1 and L2 fails, the timing capacitor $C_t$ (which is prevented from discharging through Q1, R4, and R6 by diode D5) begins discharging through variable resistor P1. When the voltage across the timing capacitor $C_t$ falls below 7.5 volts (the zener voltage of D6 minus two diode voltage drops across D5 and the emitter-base diode of Q1), voltage sensing transistor Q1 begins to conduct. Current flow through resistors R4 and R6 then causes the Darlington pair Q2, Q3 to conduct, thereby acting as a shorting means and establishing a low impedance path across the capacitor C. Capacitor C then rapidly discharges through resistor R5 and transistor Q3 to deenergize the relay coil Ry.

If the value of the variable resistor P1 is very low, the time interval between failure of the power source across lines L1 and L2 and deenergization of relay coil Ry is less than a second. At the maximum resistance setting of variable resistor P1, for example, 1 megohm, the delay time period is approximately 10 seconds. Zener diode D6 remains energized longer than the maximum timing interval due to the long time constant of capacitor C and relay coil Ry, as described above.

It can be seen that the time delay interval of the relay 20 is independent of both the exact value of the storage capacitor C and voltage across lines L1 and L2 at the instance of power source failure. Instead, the timing function is performed by the smaller timing capacitor $C_t$ and variable resistor P1, the value of which can be more readily controlled than can the value of the large storage capacitor C which is typically an electrolytic capacitor. Thus, the timing functions are entirely separate from the function of maintaining relay coil energization during the time delay period.

Other types of shorting means and voltage sensing means could be used instead of the Darlington pair Q2, Q3 and transistor Q1 and zener diode D6. Minor modifications obvious to those skilled in the art would then be required. The essential requirement is to provide some type of shorting means capable of establishing a low impedance path across the storage capacitor C after a delay period as determined by timing means such as zener diode D7, timing capacitor $C_t$, and variable resistor P1. Although other types of voltage sensing and shorting means could be provided, it has been found that the disclosed construction provides the desired performance at a very attractive cost.

In summary, it can be seen that the present invention provides an adjustable time delay relay exhibiting the reliability and flexibility of prior art pneumatic devices using low cost, low maintenance electrical components.

I claim:

1. A time delay relay adapted for energization under normal conditions by an associated external power source, said relay comprising:

a power switching device comprising input terminals and output terminals;

energy storage means connected across said input terminals for maintaining energization of said power switching device during a predetermined delay period following failure of the associated power source;

shorting means connected across said input terminals and said energy storage means, and operable when actuated to establish a low impedance path across said energy storage means and said input terminals;

timing means separate from said energy storage means and connected to said shorting means, said timing means being operable upon failure of an associated external power source to initiate said predetermined delay period and upon expiration of said predetermined delay period to actuate said shorting means and rapidly dissipate the energy stored in said energy storage means, whereby said power switching device becomes de-energized; and means for connecting the associated electrical power source to said timing means and to said energy storage means;

the values of said timing means components and the capacity of said energy storage means being selected such that said energy storage means can maintain energization of said input terminals throughout the duration of said predetermined time delay; whereby upon failure of the associated power source, said energy storage means will maintain energization of said input terminals until said timing means has operated said shorting means.

2. A time delay is recited in claim 1 wherein said timing means comprises the parallel combination of a resistor and a timing capacitor.

3. A time delay relay as recited in claim 2 wherein said storage means comprises a storage capacitor, and said time delay relay comprises a diode connected between said storage capacitor and said connecting means.

4. A time delay relay as recited in claim 3 wherein said shorting means comprises an electronic switch.

5. A time delay relay as recited in claim 4 wherein said power switching device comprises a relay coil and relay contacts operated thereby.

6. A time delay relay as recited in claim 5 comprising a zener diode connected across said parallel combination.

7. A time delay relay as recited in claim 6 wherein said electronic switch comprises voltage sensing means and amplifying means.

8. A time delay relay as recited in claim 7 wherein said voltage sensing means comprises a transistor having a pair of output elements and a control element connected to said parallel combination, said voltage sensing means also comprising a zener diode connected to one of said output elements, the other of said output elements being connected to said amplifying means, said amplifying means having a pair of output terminals operatively connected across said storage capacitor.

9. A time delay relay as recited in claim 2 wherein said resistor is an adjustable resistor.

10. A time delay relay as recited in claim 9 wherein said storage means comprises a storage capacitor, and said time delay relay comprises a diode connected between said storage capacitor and said connecting means.

11. A time delay relay as recited in claim 10 wherein said shorting means comprises an electronic switch.

12. A time delay relay as recited in claim 11 wherein said power switching device comprises a relay coil and relay contacts operated thereby.

13. A time delay relay as recited in claim 10 comprising a zener diode connected across said parallel combination.

14. A time delay relay as recited in claim 13 wherein said electronic switch comprises voltage sensing means and amplifying means.

15. A time delay relay as recited in claim 14 wherein said voltage sensing means comprises a transistor having a pair of output elements and a control element connected to said parallel combination, said voltage sensing means also comprising a zener diode connected to one of said output elements, the other of said output elements being connected to said amplifying means, said amplifying means having a pair of output terminals operatively connected across said storage capacitor.

* * * * *